(12) United States Patent
Iwaguro et al.

(10) Patent No.: US 6,608,508 B1
(45) Date of Patent: Aug. 19, 2003

(54) RESET CONTROL APPARATUS CAPABLE OF RESETTING BY EXTERNAL RESET SIGNAL WITH NARROW PULSE WIDTH

(75) Inventors: Kazuyuki Iwaguro, Tokyo (JP); Shohei Maeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/208,768

(22) Filed: Aug. 1, 2002

(65) Prior Publication Data

US 2003/0141909 A1 Jul. 31, 2003

(30) Foreign Application Priority Data

Jan. 31, 2002 (JP) ........................................ 2002-024195

(51) Int. Cl.[7] ................................................. H03L 7/00
(52) U.S. Cl. ........................................ 327/142; 327/198
(58) Field of Search ................................. 327/142, 198, 327/141

(56) References Cited

U.S. PATENT DOCUMENTS 5,537,055 A * 7/1996 Smith et al. .................... 326/8

6,188,256 B1 * 2/2001 Brins et al. ................ 327/142

FOREIGN PATENT DOCUMENTS

JP          3-242718        10/1991

* cited by examiner

*Primary Examiner*—Dinh T. Le
(74) *Attorney, Agent, or Firm*—Burns, Doane, Swecker & Mathis, LLP

(57) ABSTRACT

A reset control apparatus, which carries out reset control in response to an external reset signal, includes a count start signal generating unit for producing a count start signal in response to the external reset signal, a counter for starting counting in response to the count start signal, and a reset signal generating unit for outputting an internal reset signal in response to the external reset signal, and for halting the output of the internal reset signal while the counter counts a predetermined count value. The reset control apparatus can solve a problem of a conventional reset control apparatus in that when the pulse width of the external reset signal passing through a noise canceler is narrower than the period of the clock signal, it cannot sample the signal, and hence cannot generate the internal reset signal.

14 Claims, 7 Drawing Sheets

US 6,608,508 B1

RESET CONTROL APPARATUS CAPABLE OF RESETTING BY EXTERNAL RESET SIGNAL WITH NARROW PULSE WIDTH

This application claims priority under 35 U.S.C. §119 to Japan Application No. 2002-24195 and filed on Jan. 31, 2002, the entire content of which is hereby incorporated by reference.

BACKGROUND OF THE INVENTION

1. Field of the Invention

The present invention relates to a reset control apparatus for controlling reset of electric/electronic devices, and particularly to a reset control apparatus for controlling rest of semiconductor integrated circuits.

2. Description of Related Art

Generally, electric/electronic devices such as semiconductor integrated circuits are brought into a reset state (initial state) when supplied with a reset signal (external reset signal) from the outside. The reset control apparatus is used to secure a reset period (internal reset period) to carry out the reset of the electric/electronic devices positively regardless of the input period (assertion period) of the external reset signal.

FIG. 6 is a block diagram showing a configuration of a conventional reset control apparatus. In FIG. 6, the reference numeral 1 designates an external reset terminal, 2 designates a noise canceler, 3 designates a D-type flip-flop, 4 designates a D-type flip-flop (F/F), 5 designates an AND gate, 6 designates a combinational circuit, 7 designates an AND gate, 8 designates a D-type latch, 9 designates a counter, 10 designates a D-type flip-flop (F/F), and 11 designates an inverter. The F/F 10 is supplied with a clock signal CLK, and the D-type latch 3 and F/F 4 are supplied with an inverted signal of the clock signal CLK, which is represented by a bar over the symbol CLK, and is called inverted clock signal CLK bar from now on. The conventional reset control apparatus produces the internal reset signal in response to the external reset signal supplied via the external reset terminal 1, and resets the semiconductor integrated circuit by the internal reset signal.

Next, the operation of the conventional reset control apparatus will be described.

FIG. 7 is a timing chart illustrating the operation of the reset control apparatus shown in FIG. 6. The reset operation will be described with reference to FIGS. 6 and 7.

First, it is assumed that the F/F 10 is supplied with the clock signal CLK, and the D-type latch 3 and F/F 4 are supplied with the inverted clock signal CLK bar as shown in FIG. 7. The external reset signal fed via the external reset terminal 1 is supplied to the D-type latch 3 through the noise canceler 2 as a noise canceled signal (NC signal) Here, the period in which the external reset signal is at a low level (L level) is referred to as an assertion period. The noise canceler 2 is used for eliminating noise superimposed on the external reset signal. Eliminating the noise by the noise canceler 2 can prevent the malfunction by noise, The D-type latch 3 latches the NC signal by the inverted clock signal CLK bar, and outputs a latch signal. The latch signal is supplied to the F/F 4 that outputs an F/F signal. As shown in FIG. 6, the latch signal and F/F signal are supplied to the combinational circuit 6. When the external reset signal (the NC signal) is placed at the L level, and the inverted clock signal CLK bar changes from a high level (H level) to the L level, the Q terminal of the D-type latch 3 changes to the L level, that is, the latch signal becomes L level.

When the latch signal becomes L level, the F/F signal also becomes L level. When one of the latch signal and F/F signal becomes L level, the combinational circuit 6 delivers the internal reset signal. In other words, the internal reset signal becomes L level, thereby bringing about the internal reset input. In this way, the D-type latch 3 and F/F 4 synchronize the NC signal with the inverted clock signal CLK bar. In addition, the combinational circuit 6 outputs the internal reset signal in response to the NC signal.

The AND gate 5 is supplied with the latch signal and the inverted signal of the F/F signal. After the external reset signal (that is, the NC signal) changes from the L to H level, the D-type latch 3 places its Q terminal at the H level (that is, the latch signal is placed at the H level) at the timing at which the inverted clock signal CLK bar changes from L to H level. On the other hand, the F/F 4 brings the F/F signal to the H level one period of the inverted clock signal CLK bar has elapsed after the latch signal becomes H level. As a result, the AND gate 5 outputs a start (ST) signal of H level at the timing as illustrated in FIG. 7.

The ST signal is supplied to the AND gate 7 and D-type latch 8. The AND gate 7 is also supplied with the clock signal CLK. When both the clock signal CLK and ST signal are at H level, the AND gate 7 produces a signal (AND signal) of H level. As a result, the D-type latch 8 outputs an enabling (EN) signal which is placed at the H level when the AND-signal and ST signal are both at H level.

The EN signal is supplied to the combinational circuit 6 and counter 9. Receiving the EN signal of the H level, the combinational circuit 6 delivers the internal reset signal, that is, places the internal reset signal at the L level, even though the latch signal and F/F signal output from the D-type latch 3 and F/F 4 are at the H level.

On the other hand, the-counter 9, receiving the EN signal at the H level, starts counting of a predetermined time period (count enabled). When it counts the predetermined time period, the counter 9 counts up (overflows), and outputs an overflow (ovf) signal. The ovf signal is supplied to the F/F 10 that produces a clear signal in response to the ovf signal. In response to the clear signal, the D-type latch 8 is reset, and the EN signal is placed at the L level. In response to the EN signal placed at the L level, the combinational circuit 6 halts to deliver the internal reset-signal, that is, places the internal reset signal at the H level, thereby releasing the internal reset.

The NC signal is supplied to the counter 9 via the inverter 11 as the initialization signal, in response to which the counter 9 is initialized.

Thus generating the internal reset signal in response to the external reset signal enables the internal reset signal to positively reset internal resources of the semiconductor integrated circuit regardless of the assertion period of the external reset signal.

As described above, the conventional reset control apparatus must use the noise canceler to eliminate the noise superimposed on the external reset signal. Therefore, it is unavoidable that the external reset signal passing through the noise canceler, that is, the NC signal, has a shorter pulse width than the external reset signal. Thus, when the noise is superimposed on the external reset signal, the noise canceler reduces the pulse width of the external reset signal by an amount corresponding to the noise canceling width as shown in FIG. 8. As a result, the width of the NC signal becomes narrower than that of the external reset signal.

The conventional reset control apparatus samples the NC signal in synchronism with the clock signal, and generates the internal reset signal in response to the sampled result. Therefore, when the pulse width of the NC signal after the noise canceling is narrower than the period of the clock signal, the conventional reset control apparatus cannot sample the NC signal. As a result, the internal reset signal does not become L level as illustrated in FIG. 9, and the ST signal continues its L level. When the ST signal is at the L level, the EN signal also maintains the L level state, thereby preventing the counter from starting its count.

Thus, when the pulse width of the NC signal is narrower than the period of the clock signal, the conventional reset control apparatus cannot sample the NC signal, that is, cannot generate the internal reset signal. In other words, it cannot carry out the reset even if the external reset signal is input. This fact applies to the case where the pulse width of the external reset signal is narrower than the period of the clock signal when the external reset signal is supplied to the D-type latch 3 directly.

With the foregoing configuration, the conventional reset control apparatus cannot sample the NC signal if the pulse width of the external reset signal passing through the noise canceler (that is, the NC signal) is narrower than the period of the clock signal. As a result, it has a problem of being unable to generate the internal reset signal. Thus, it cannot perform the reset even though the external reset signal is input.

The conventional reset control apparatus generates the internal reset signal in response to the input of the external reset signal. Therefore, it generates the internal reset signal regardless of the state of the semiconductor integrated circuit whenever the external reset signal is supplied. For example, if the external reset signal is input while the CPU is carrying out the memory access in the semiconductor integrated circuit, the internal reset signal performs the reset. This presents a problem of destroying the contents of the memory. In other words, in spite of the operation to avoid the reset, it carries out the reset in response to the external reset signal, thereby offering a problem of causing a serious failure in the electric/electronic device such as a semiconductor integrated circuit.

SUMMARY OF THE INVENTION

The present invention is implemented to solve the foregoing problems. It is therefore an object of the present invention to provide a reset control apparatus capable of achieving the reset positively regardless of the pulse width of the external reset signal.

Another object of the present invention is to provide the reset control apparatus capable of carrying out the reset selectively depending on whether the reset avoiding operation is being performed or not.

According to a first aspect of the present invention, there is provided a reset control apparatus comprising: count start signal generating means for producing a count start signal in response to an external reset signal; counter means for starting counting in response to the count start signal; and reset signal generating means for outputting an internal reset signal in response to the external reset signal, and for halting the output of the internal reset signal when the counter means counts a predetermined count value. It offers an advantage of being able to reset without fail regardless of the pulse width of the external reset signal.

According to a second aspect of the present invention, there is provided a reset control apparatus comprising: count start signal generating means for producing a count start signal in response to the external reset signal; counter means for starting counting in response to the count start signal; first reset signal generating means for outputting a first internal reset signal in response to the external reset signal; and second reset signal generating means for outputting a second internal reset signal when the counter means counts a predetermined first count value. Using one of the first and second internal reset signals selectively, it offers an advantage of being able to carry out the reset selectively depending on whether the device to be reset is performing operation to avoid the reset or not.

DETAILED DESCRIPTION OF THE PREFERRED EMBODIMENTS

The invention will now be described with reference to the accompanying drawings.

EMBODIMENT 1

Figure 1:
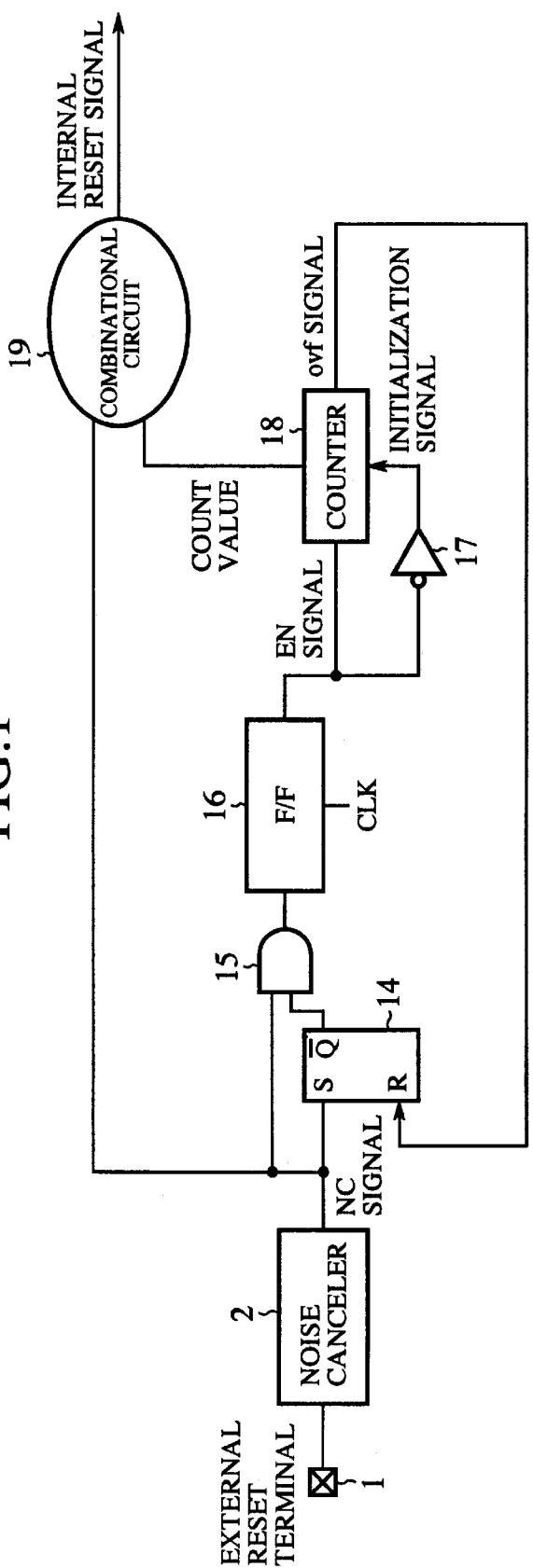
FIG. 1 is a block diagram showing a configuration of an embodiment 1 of the reset control apparatus in accordance with the present invention.
Figure 6:
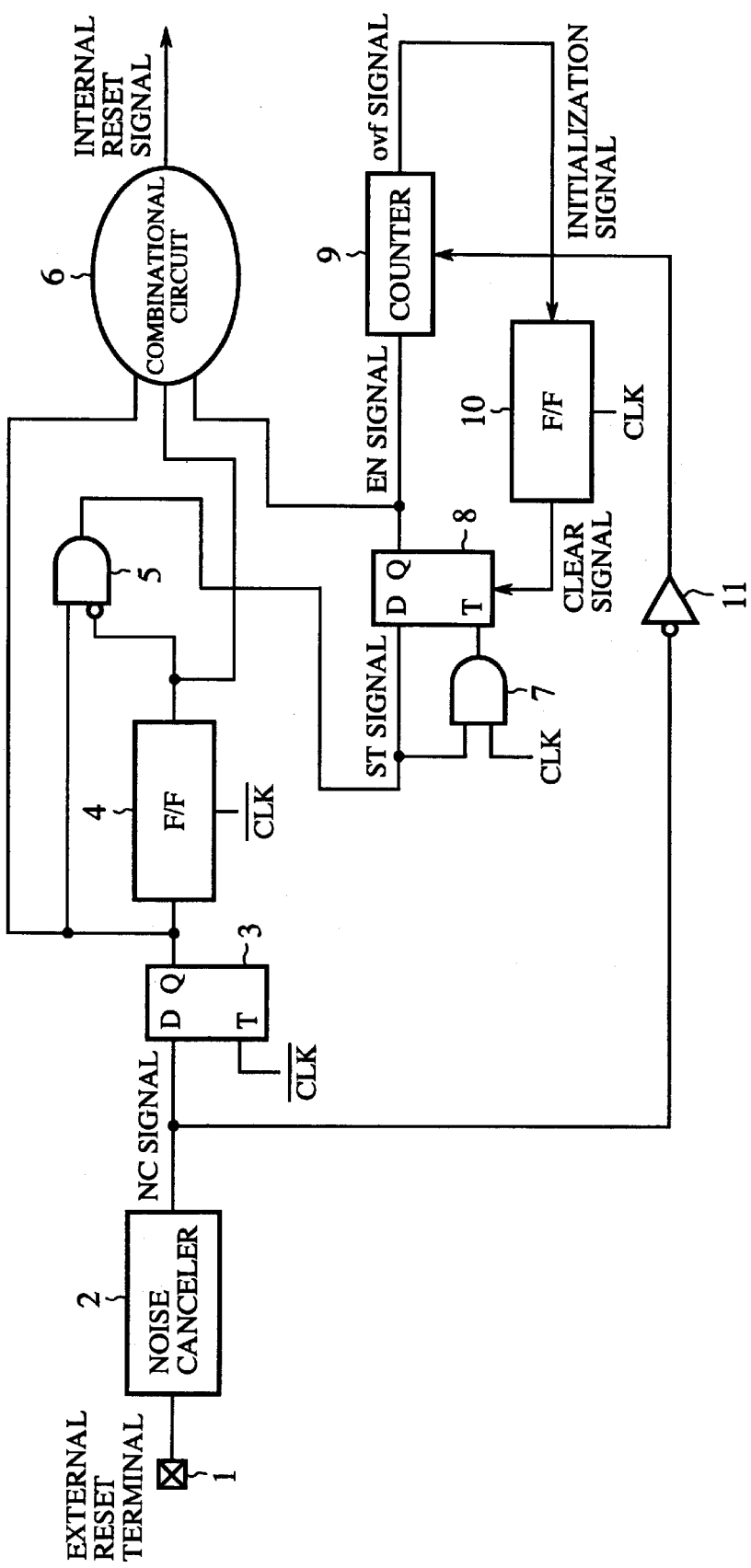
FIG. 6 is a block diagram showing a configuration of a conventional reset control apparatus.
Figure 7:
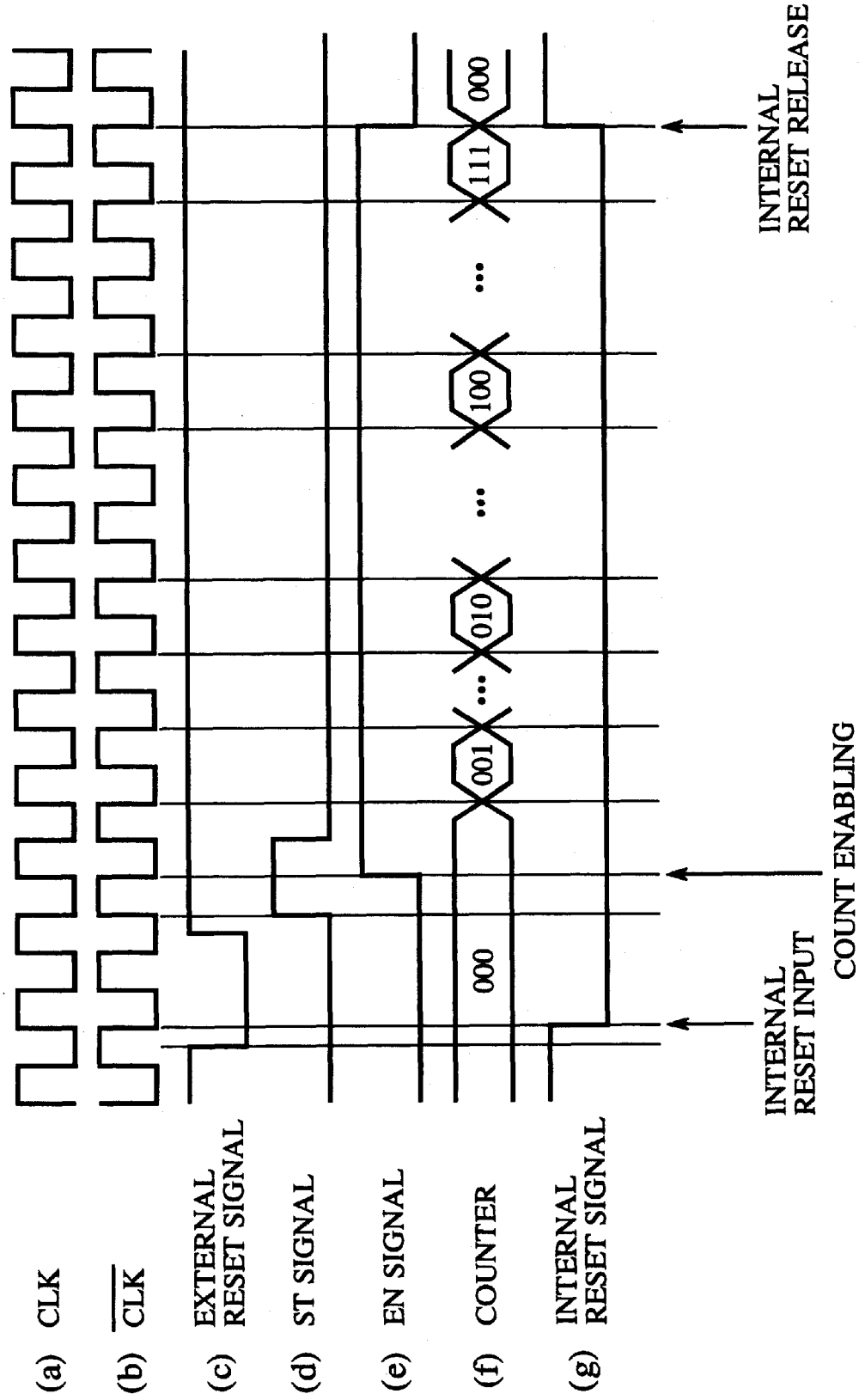
FIG. 7 is a timing chart illustrating the operation of the conventional reset control apparatus of FIG. 6.
Figure 8:
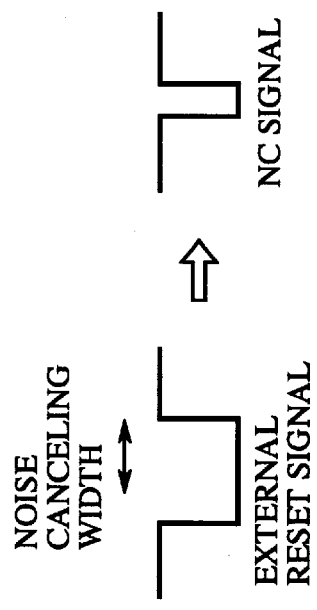
FIG. 8 is a diagram showing a comparison of the pulse width of the noise canceled signal and the pulse width of the external reset signal.
Figure 9:
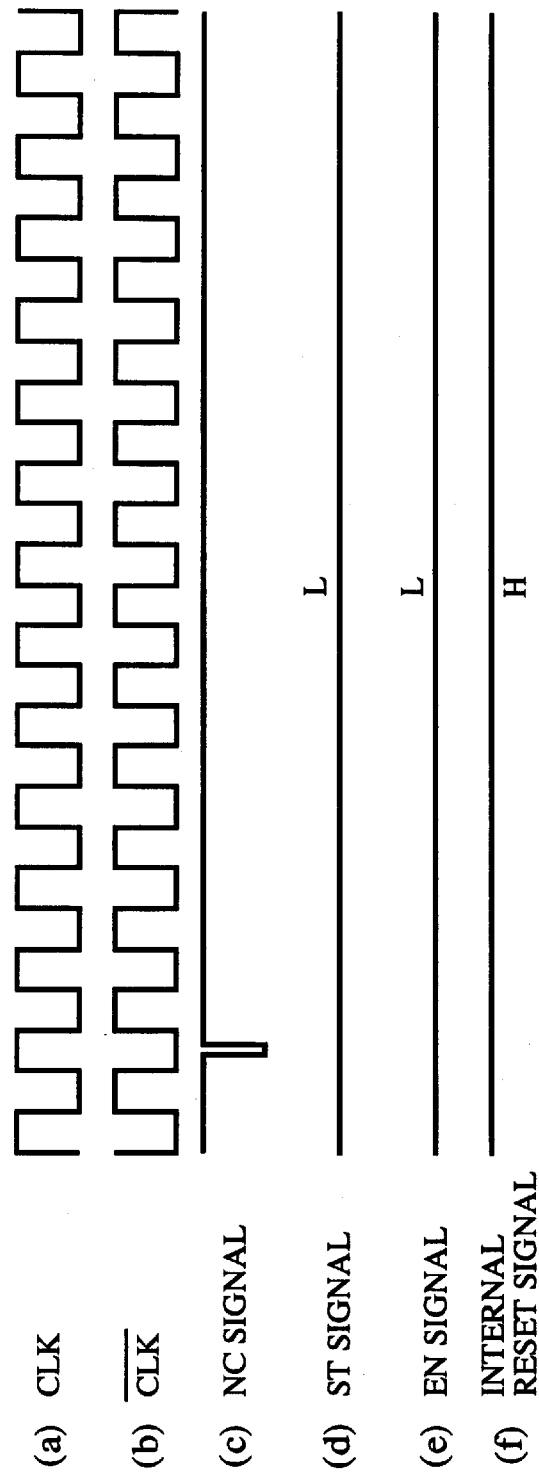
FIG. 9 is a timing chart illustrating the operation of the conventional reset control apparatus in FIG. 6 when the pulse width of the noise canceled signal is narrow.

FIG. 1 is a block diagram showing a configuration of an embodiment 1 of the reset control apparatus in accordance with the present invention. In FIG. 1, the same reference numerals designate the same components as those of FIG. 6. The reference numeral 14 designates an S-R flip-flop (S-R F/F), 15 designates an AND gate, 16 designates an F/F, 17 designates an inverter, 18 designates a counter (counter means), and 19 designates a combinational circuit (reset signal generating means) The F/F 16 is supplied with the clock signal CLK. The reset control apparatus outputs an internal reset signal in response to an external reset signal supplied from the external reset terminal 1.

Figure 2:
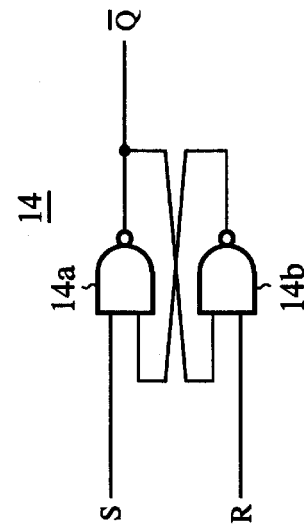
FIG. 2 is a circuit diagram showing a configuration of the S-R flip-flop of FIG. 1.

FIG. 2 is a circuit diagram showing a configuration of the S-R flip-flop 14 in FIG. 1. In FIG. 2, the S-R F/F 14 includes NAND gates 14a and 14b, and produces an output signal from a Q-bar terminal in response to signals supplied to an S (set) terminal and an R (reset) terminal.

Next, the operation of the present embodiment 1 will be described.

Figure 3:
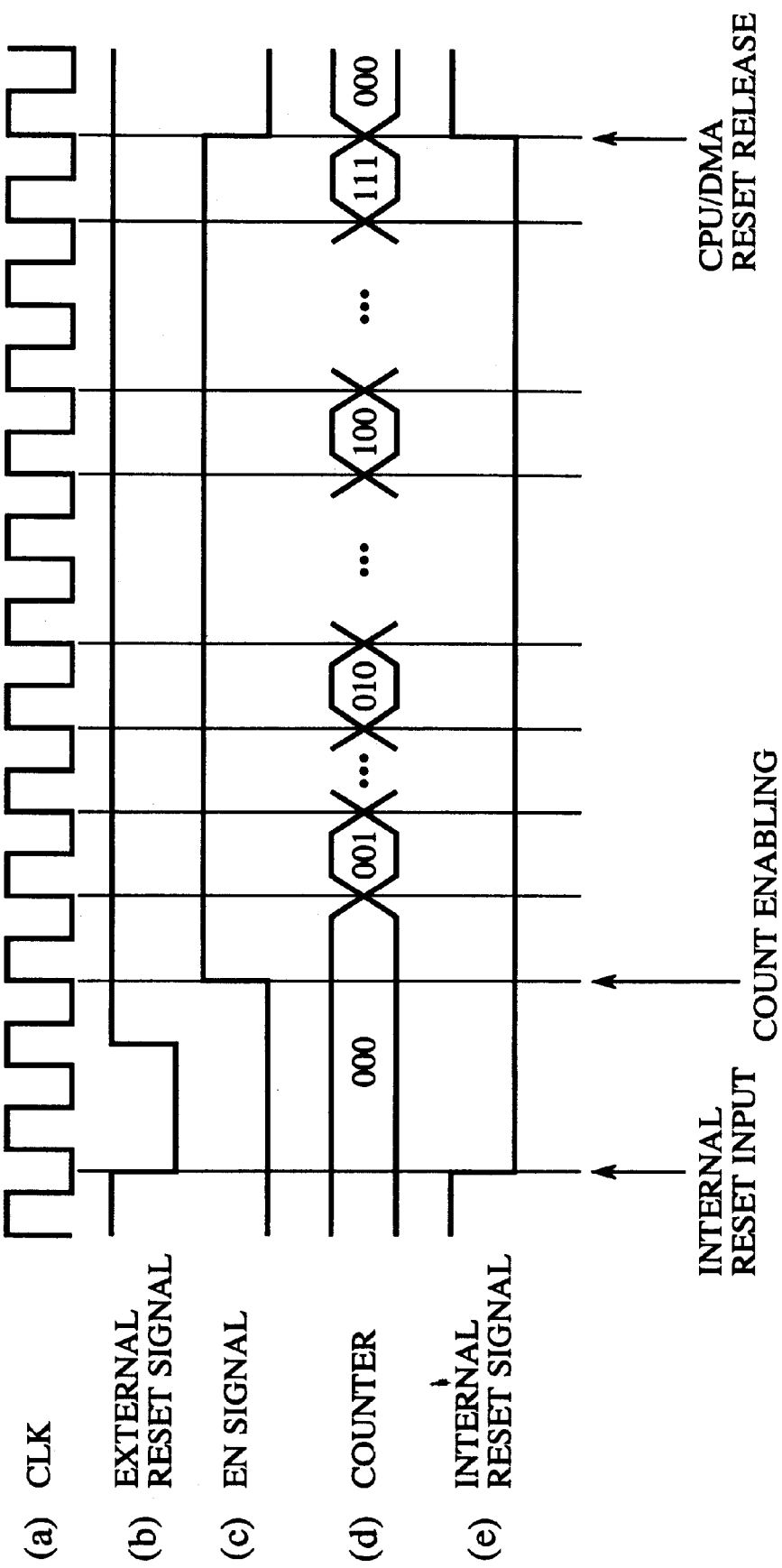
FIG. 3 is a timing chart illustrating the operation of the reset control apparatus of FIG. 1.

FIG. 3 is a timing chart illustrating the operation of the reset control apparatus of FIG. 1. Referring to FIGS. 1 and 3, the reset operation of the internal resources of the semiconductor integrated circuit such as a CPU/DMA (dynamic memory access unit) will be described.

First, the F/F 16 is supplied with the clock signal CLK of FIG. 3(*a*). As described in connection with FIG. 6, the noise canceler 2 cancels out the noise of the external reset signal fed through the external reset terminal 1, and outputs it as the NC signal. The NC signal is supplied to the S-R F/F 14, AND gate 15, and combinational circuit 19.

When the external reset signal becomes L level, the NC signal becomes L level, and the combinational circuit 19 delivers the internal reset signal (brings the internal reset signal to the L level). The internal reset signal resets the internal resources of the semiconductor integrated circuit. The combinational circuit 19 maintains the internal reset signal at the L level until the count value becomes the predetermined count value even when the NC signal becomes H level, which will be described later.

In response to the L level NC signal supplied to the S terminal of the S-R F/F 14, the Q bar terminal of the S-R-F/F 14 becomes H level, thereby sampling the NC signal. Thus, the S-R F/F 14 outputs a set signal.

When the NC-signal changes from L level to H level, the Q bar terminal of the S-R F/F 14 maintains the H level. Accordingly, the AND gate 15 outputs an H level AND signal. When the output terminal of the AND gate 15 becomes H level, the output terminal of the F/F 16 becomes H level. The output of the F/F 16 is supplied to the inverter 17 and counter 18 as an EN signal (count start signal). The inverter 17 inverts the EN signal, and supplies it to the counter 18 as the initialization signal. Thus, the counter 18 is initialized.

Receiving the EN signal of H level, the counter 18 starts to count the predetermined time period (predetermined count value CN) (count enabling). The counter 18 supplies its count value to the combinational circuit 19. When the count value reaches the predetermined count value CN, the combinational circuit 19 stops delivering the internal reset signal. In other words, it places the internal reset signal at H level, thereby releasing the reset of the CPU/DMA.

On the other hand, completing the counting of the count value CN, the counter 18 overflows, and produces the ovf signal. The ovf signal is supplied to the R terminal of the S-R F/F 14. Receiving the ovf signal at the R terminal, the S-R F/F 14 places the output of the Q bar terminal to L level (reset state). As a result, the output terminal of the AND gate 15 is placed at the L level regardless of the NC signal. On the other hand, the F/F 16 brings the EN signal to L level one period of the clock signal CLK has elapsed from the time when the AND signal becomes L level. Thus, the counter 18 is disabled (stops counting).

As is clear from the foregoing description, the S-R F/F 14, AND gate 15 and F/F 16 operate as a count start signal generating means, and the AND gate 15 and F/F 16 operate as a count start signal generating section.

In summary, the present embodiment 1 is configured such that it places the internal reset signal at L level in response to the output (NC signal) of the noise canceler, and samples the NC signal using the S-R F/F. It starts the counter in response to the sampled result, and places the internal reset signal at H level after the predetermined time period. In other words, it starts the counter by sampling the NC signal using the S-R F/F, and determines the output period (internal reset period) of the internal reset signal. Thus, it can generate the internal reset signal reliably even if the pulse width of the NC signal is narrower than the period of the clock signal. In this case, the S-R F/F 14 maintains its Q bar terminal at H level until the ovf signal is supplied to its R terminal, once the NC signal fed to its S terminal has become L level. As a result, even if the pulse width of the NC signal is narrower than the period of the clock signal, the present embodiment 1 can generate the internal reset signal without fail.

In addition, since the present embodiment 1 initializes the counter in response to the output of the S-R F/F, it can initialize the counter reliably even if the pulse width of the NC signal is narrower than the period of the clock signal.

Incidentally, the reset control apparatus as shown in FIG. 1 is applicable not only to the initialization of the internal resources of the semiconductor integrated circuit, but also to the reset control of the electric/electronic devices.

As described above, the present embodiment 1 is configured such that it samples the output of the noise canceler corresponding to the external reset signal using the S-R F/F, starts the counter, and defines the internal reset period of the internal reset signal. Accordingly, it can secure the internal reset period of the internal reset signal even if the pulse width of the NC signal is narrower than the period of the clock signal. As a result, the present embodiment 1 can reset the internal resources of the semiconductor integrated circuit positively.

EMBODIMENT 2

Figure 4:
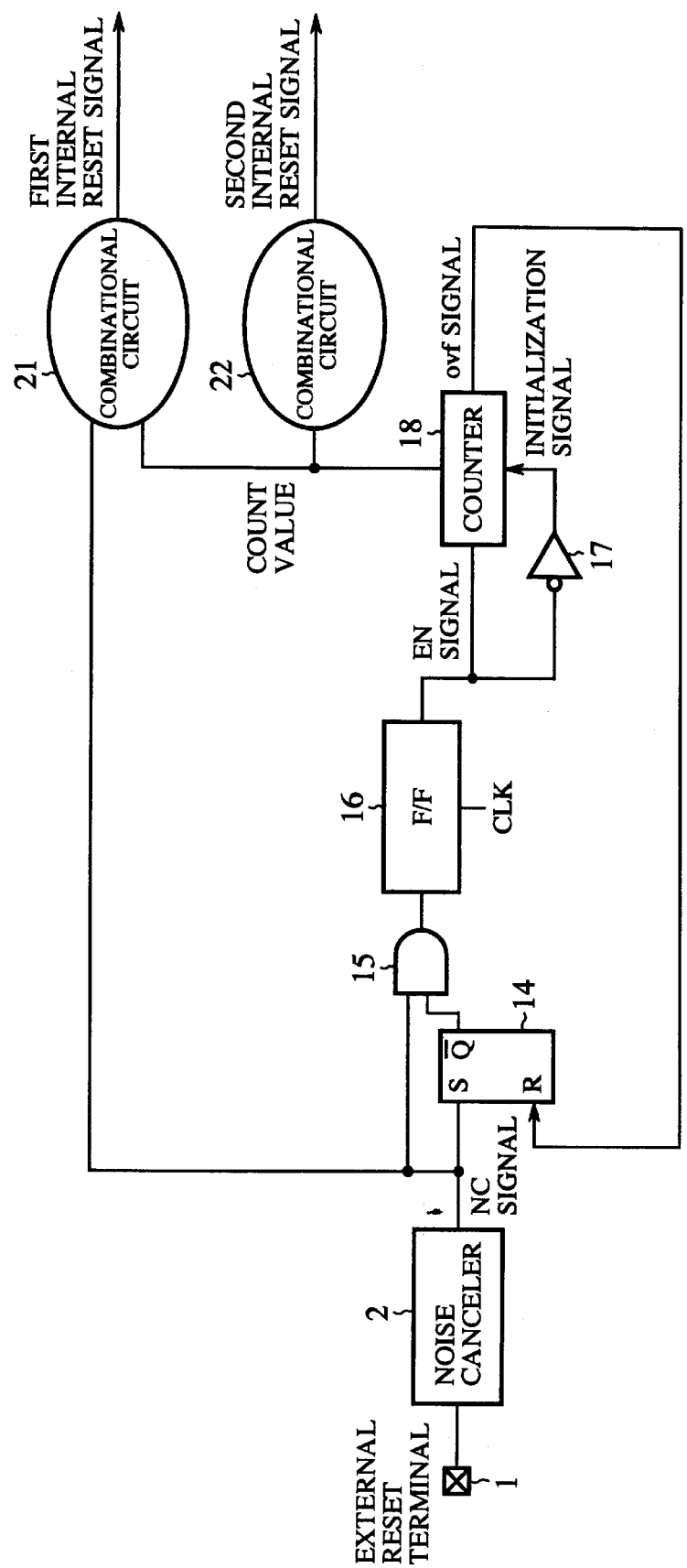
FIG. 4 is a block diagram showing a configuration of an embodiment 2 of the reset control apparatus in accordance with the present invention.

FIG. 4 is a block diagram showing a configuration of an embodiment 2 of the reset control apparatus in accordance with the present invention. In FIG. 4, the same reference numerals designate the same components as those of FIG. 1. The reset control apparatus as shown in FIG. 4 includes a first and second combinational circuits 21 and 22.

Next, the operation of the present embodiment 2 will be described.

Figure 5:
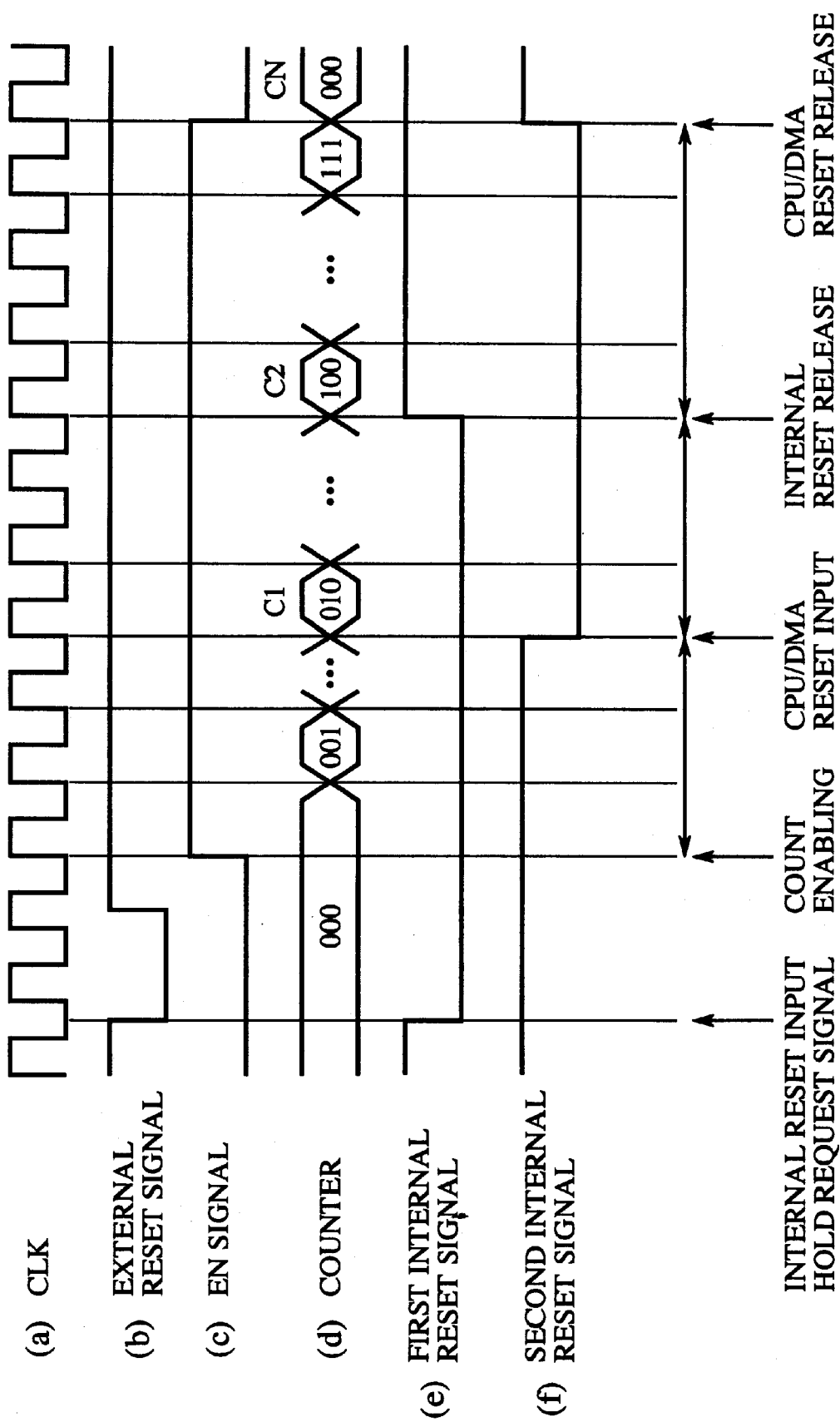
FIG. 5 is a timing chart illustrating the operation of the reset control apparatus of FIG. 4.

FIG. 5 is a timing chart illustrating the operation of the reset control apparatus of FIG. 4. Referring to FIGS. 4 and 5, the reset operation will be described in detail.

As described above in the foregoing embodiment 1, the F/F 16 is supplied with the clock signal CLK of FIG. 5(*a*) Then, the noise canceler 2 cancels out the noise of the external reset signal fed through the external reset terminal 1, and outputs it as the NC signal. The NC signal is supplied to the S-R F/F 14, AND gate 15, and first combinational circuit 21.

When the NC signal becomes L level, the first combinational circuit 21 produces the first internal reset signal (brings the first internal reset signal to L level) The first internal reset signal is used as a hold request for requesting to stop the internal bus access, and as a reset signal of the internal resources except for the CPU/DMA (internal reset input and hold request signal) More specifically, receiving the first internal reset signal, the semiconductor integrated circuit relinquishes the internal bus after completing the bus access, and resets the internal resources except for the CPU/DMA. Then, the first combinational circuit 21 maintains the first internal reset signal at L level until the count value reaches a second count value C2 even if the NC signal becomes H level.

When the NC signal becomes L level, the Q bar terminal of the S-R F/F 14 is changed to H level. At the timing when the NC signal changes from L level to H level, the output, of the AND gate 15 is placed at H level, and the output of the F/F 16 at H level, thereby placing the EN signal at H level. The inverter 17 inverts the EN signal and supplies it to the counter 18 as the initialization signal, thereby initializing the counter 18.

When the EN signal rises to H level, the counter 18 starts counting of the predetermined time period (predetermined count value CN). Then, the counter 18. supplies its count value to the first and second combinational circuits 21 and 22. When the count value reaches a predetermined first count value C1 (C1<C2<CN), the second combinational circuit 22 delivers the second internal reset signal (brings the second internal reset signal to L level). The second internal reset signal is used as the internal reset signal of the CPU/DMA (reset input to the CPU/DMA), for example. In other words, receiving the second internal reset signal, the semiconductor integrated circuit resets the CPU/DMA. The first count value C1 is set at a time period that is enough for the currently executed memory access to be completed after the external reset signal is input.

When the count value reaches the second count value C2, the first combinational circuit 21 stops the first internal reset signal (places the first internal reset signal at H level), thereby releasing the internal reset as illustrated in FIG. 5(*e*).

When the count value reaches the predetermined count value CN, the second combinational circuit 22 stops delivering the second internal reset signal (places the second internal reset signal at H level), thereby releasing the reset of the CPU/DMA.

Completing the count of the count value CN, the counter 18 overflows and supplies the ovf signal to the R terminal of the S-R F/F 14. Thus, the S-R F/F 14 enters the reset state, placing the output terminal of the AND gate 15 at L level. The F/F 16 brings the EN signal to L level one period of the clock signal CLK has elapsed from the time when the AND signal becomes H level. Thus, the counter 18 is disabled, thereby stopping the counter.

In summary, the present embodiment 2 is configured such that it places the first internal reset signal at L level in response to the output (NC signal) of the noise canceler, and samples the NC signal using the S-R F/F. It starts the counter in response to the sampled result, and places the second internal reset signal at L level when the count value reaches the first count value C1. The present embodiment 2 utilizes the first internal reset signal not only as the hold request signal, but also as the reset input for the internal resources such as the CPU/DMA, and utilizes the second internal reset signal as the reset input to the CPU/DMA. Thus, it can carry out the reset reliably even if the pulse width of the NC signal is narrower than the period of the clock signal. In addition, even if the external reset signal is input during the memory access operation of the CPU/DMA, the contents of the memory are not destroyed.

As is clear from the foregoing description, the first combinational circuit 21 operates as the first internal reset signal generating means, and the second combinational circuit 22 operates as the second internal reset signal generating means.

The reset control apparatus as shown in FIG. 4 is applicable not only to the reset of the internal resources of the semiconductor integrated circuit, but also to the reset control of other electric/electronic devices.

As described above, the present embodiment 2 is configured such that in response to the input of the external reset signal, it requests to stop the internal bus access and to reset the internal resources other than the CPU/DMA using the first internal reset signal, and that it samples the external reset signal by the S-R F/F, starts the counter, and resets the CPU/DMA by the second internal reset signal when the count value of the counter reaches the predetermined count value. Thus, the present embodiment 2 can reset the internal resources other than the CPU/DMA immediately after the input of the external reset signal, and resets the CPU/DMA after completing the memory access, thereby protecting the contents of the memory.

What is claimed is:

1. A reset control apparatus for carrying out reset control in response to an external reset signal, said reset control apparatus comprising:

count start signal generating means for producing a count start signal in response to the external reset signal;

counter means for starting counting in response to the count start signal; and reset signal generating means coupled to said counter means for outputting an internal reset signal in response to the external reset signal, and for halting the output of the internal reset signal when said counter means counts a predetermined count value.

2. The reset control apparatus according to claim 1, wherein said count start signal generating means halts the count start signal when said counter means counts up to the predetermined count value.

3. The reset control apparatus according to claim 2, wherein said count start signal generating means comprises an S-R flip-flop whose S terminal is supplied with an input signal corresponding to the external reset signal; and a count start signal generating section for generating the count start signal in response to an output signal of said S-R flip-flop and to the input signal.

4. The reset control apparatus according to claim 3, wherein said counter means resets said S-R flip-flop by supplying an R terminal of said S-R flip-flop with a count-up signal when said counter means completes counting.

5. The reset control apparatus according to claim 3, further comprising a noise canceler for generating a noise canceled signal by performing noise canceling processing of the external reset signal, wherein the noise canceled signals is used, as the input signal and is supplied to said reset signal generating means.

6. A reset control apparatus for carrying out reset control in response to an external reset signal, said reset control apparatus comprising:

count start signal generating means for producing a count start signal in response to the external reset signal;

counter means for starting counting in response to the count start signal;

first reset signal generating means coupled to said counter means for outputting a first internal reset signal in response to the external reset signal; and second reset signal generating means coupled to said counter means for outputting a second internal reset signal when said counter means counts a predetermined first count value.

7. The reset control apparatus according to claim 6, wherein said first reset signal generating means halts producing the first internal reset signal when said counter means counts a predetermined second count value.

8. The reset control apparatus according to claim 7, wherein said second reset signal generating means halts producing the second internal reset signal when said counter means counts a predetermined third count value longer than the first count value.

9. The reset control apparatus according to claim 8, where the first count value, the second count value and the third count value increase in this order.

10. The reset control apparatus according to claim 6, wherein said reset control apparatus is used for an electric/electronic device including at least a CPU/DMA and other internal resources, wherein the first internal reset signal is used as a hold request signal for requiring to halt memory access, and as a reset signal for resetting said other internal resources, and wherein the second internal reset signal is used as a signal for resetting said CPU/DMA.

11. The reset control apparatus according to claim 6, wherein said count start signal generating means halts the count start signal when said counter means counts up to the predetermined third count value.

12. The reset control apparatus according to claim 11, wherein said count start signal generating means comprises an S-R flip-flop whose S terminal is supplied with an input signal corresponding to the external reset signal; and a count start signal generating section for generating the count start signal in response to an output signal of said S-R flip-flop and to the input signal.

13. The reset control apparatus according to claim 12, wherein said counter means resets said S-R flip-flop by supplying an R terminal of said S-R flip-flop with a count up signal when said counter means completes counting.

14. The reset control apparatus according to claim 12, further comprising a noise canceler for generating a noise canceled signal by performing noise canceling processing of the external reset signal, wherein the noise canceled signal is used as the input signal and is supplied to said first reset signal generating means.

* * * * *